(12) United States Patent
Blakely

(10) Patent No.: US 7,615,988 B2
(45) Date of Patent: Nov. 10, 2009

(54) WIDE RANGE CURRENT SENSING METHOD AND SYSTEM

(75) Inventor: John Herman Blakely, Weaverville, NC (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 11/705,373

(22) Filed: Feb. 12, 2007

(65) Prior Publication Data

US 2008/0191703 A1  Aug. 14, 2008

(51) Int. Cl.
*G01R 15/18* (2006.01)
(52) U.S. Cl. .................................................... 324/127
(58) Field of Classification Search .............. 324/127, 324/117 R; 336/174–176
See application file for complete search history.

(56) References Cited

U.S. PATENT DOCUMENTS 4,947,126 A * 8/1990 May et al. .................. 324/509
5,426,360 A * 6/1995 Maraio et al. ............... 324/126
2007/0182401 A1* 8/2007 Driehorn et al. ............ 324/127
2008/0042637 A1* 2/2008 Sandquist et al. ....... 324/117 R

OTHER PUBLICATIONS

Flex-Core data sheet, Jan. 19, 2007, Flex-Core, http://web.archive.org/web/20061015192227/www.flex-core.com/pdf-files/New+pdf+files/New_Folder/group+pdf/FCL.pdf.*

* cited by examiner

*Primary Examiner*—Ha Tran T Nguyen
*Assistant Examiner*—Shaun Campbell
(74) *Attorney, Agent, or Firm*—Fletcher Yoder Law; Alexander R. Kuszewski

(57) ABSTRACT

A current measurement technique is disclosed in which a family of transformer coils having the same number of turns and the same winding resistance may be associated an active circuit for presenting a burden resistance of substantially zero value. The impedance of the coils will vary with their window size, and the active circuitry will reduce the burden resistance accordingly so that reductions and impedance do not result in introducing additional error into measurements. The circuitry may be used for measuring current in single conductors or in multiple conductors passing through the transformer coil, such as for ground fault measurement, monitoring and control.

19 Claims, 4 Drawing Sheets

WIDE RANGE CURRENT SENSING METHOD AND SYSTEM

BACKGROUND

The present invention relates generally to the field of current sensing devices. More particularly, the invention relates to a wide range current sensing arrangement suitable for use with different sizes of current transformer coils.

A range of devices are known and are currently in use for measuring current in electrical systems. Such current measurements are used for a many purposes, including for monitoring and control, both manual and automated. For example, in a single-phase AC electrical system, a current may be measured to evaluate the normal operation of electrical equipment, analyze power usage, control electrical components, or determine when an abnormal condition exists. In three-phase AC electrical systems, similar purposes may exist for measuring currents in individual phase conductors. Moreover, currents are often detected for multiple phase conductors to detect phase imbalances that could be indicative of ground faults.

A common technique for measuring currents is to pass a conductor through a ring-like coil and measure current induced in the coil resulting from the field produced by a current flowing through the conductor. Practical product offerings of this type, however, may require different sizes of current transformer coils. These sizes may be required to accommodate different sizes or numbers of conductors. For example, current through smaller conductors is more accurately measured by the use of transformer coils with a smaller opening or window through which the conductor passes. Larger conductors require larger windows. Where three phase conductors are to be routed through a single transformer coil, such as for ground fault detection, the window in the coil must be sufficiently large to accommodate the multiple conductors.

In general, the most important criterion for a current measuring system is the ability to measure current accurately. The range of primary conductor currents may be accommodated by using multiple different transformer coil sizes. Ranges of measured currents can range from sub-Ampere levels to thousands of Amperes. Although this may not be the current actually measured (e.g., in ground fault protection systems where imbalances are measured), the current through the primary conductors determines the sizes of these conductors. It is these sizes that dictate the window size for the current transformer coil. In the case of ground fault detection, the anticipated detected current levels can range from milli-Amperes to several Amperes of current, although somewhat larger coil windows may be required to accommodate the multiple conductors.

Generally, the sizes of burden resistors, as well as the number of turns of wire in the transformers must be changed when the current range or window size is changed. For example, a current transformer is modeled as a current source in parallel with a magnetizing impedance ($jX_{Lm}$), in parallel with the sum of a burden resistor value and the resistance of the coil winding ($R_b + R_w$). The number of turns must normally be increased when the diameter of the transformer coil increases due to the decrease in the magnetizing impedance. This impedance is inversely proportional to the mean diameter of the transformer coil ring. As a result, a current divider is formed with the impedance and the burden resistor value. If the value of $jX_{Lm}/(jX_{Lm}+R_w+R_b)$ is approximately equal unity, then virtually all of the current source current will flow into the burden resistor. This will result in a minimum error for the voltage developed on the burden resistor.

However, if the number of turns or the burden resistor value changes, the net gain of this circuit also changes. This can be problematic due to the electronic circuitry utilized, which will not otherwise account for the new scaling factor resulting from the changed gain. Existing techniques for accounting for this change include varying a number of turns for different sizes of transducer coils, and changing the burden resistor value to match the value of $jX_{Lm}$. However, this can lead to errors in adjustment, selection, and so forth.

There is a need, therefore, for an improved technique for measuring current for a wide range of conductors and anticipated current values.

BRIEF DESCRIPTION

The present invention provides a novel method and system designed to respond to such needs. The arrangement makes use of a plurality of different transformer coils through which one or more conductors may pass to measure currents through the conductors. The transformer coils are differently sized, but are similar insomuch as they have the same number of turns of the same size wire. The transformer coils may also have the same cross-sectional area. An active circuit, then, may be coupled to any one of the transformer coils and provides a burden resistance value that is substantially equal to zero. Consequently, virtually all current will flow through the burden resistor independent of the values of the impedance, so long as $R_w$ is significantly less than $jX_{Lm}$.

The resulting current measurement system and method may be used in a wide range of settings. For example, the arrangement may be used to measure currents in single-phase or multi-phase systems and conductors. Where multiple conductors in a three-phase system are passed through the transformer, the technique may be used to detect ground faults. The active circuit may be adjusted manually or automatically, such as by a programmed microprocessor. Moreover, the range of currents that can be accurately detected with the technique can be adjusted by appropriate selection of components of the active circuit.

In a presently contemplated embodiment, for example, the window size for transformer coils can vary in a ratio of 10:1 to accommodate different sizes of conductors. The active circuit nevertheless maintains the effective burden resistance at approximately zero ohms, such as by using a current to voltage operational amplifier circuit. This circuit presents a virtual ground and ground termination for the current transformer. By consequence, the value Of $jX_{Lm}$ can be reduced (as the mean diameter of the transformer core is increased) without excessive error being introduced into measurements. By maintaining a constant number of turns for each of the transformer coils, the sensing circuit does not experience scaling variances. In a presently contemplated embodiment, a 2500:1 input variation and a 2500:1 output variation is obtained through the use of simple gain control.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
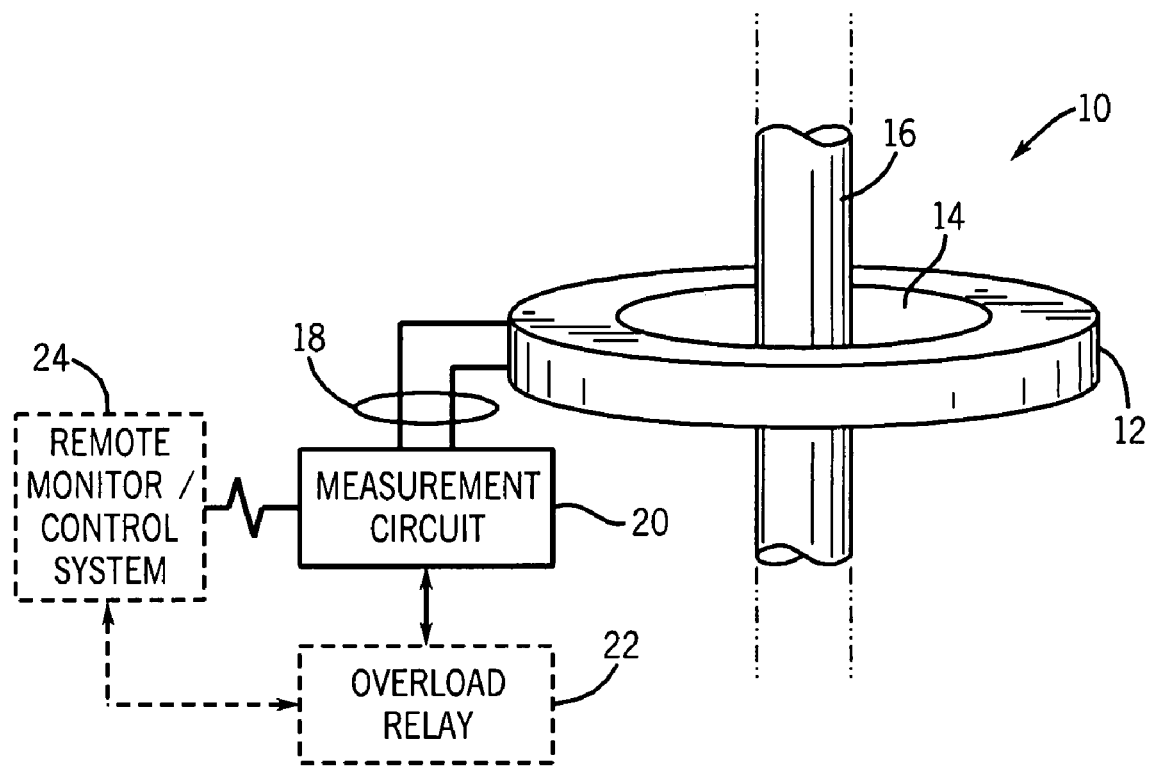
FIG. 1 is a diagrammatical overview of a current measurement system in accordance with aspects of the present technique.

Turning now to the drawings, and referring first to FIG. 1, a current measurement system is generally illustrated and designated by reference numeral 10. The system includes a current transformer coil 12 designed as an annular structure surrounding a window 14. A conductor 16 may pass through the window and current through the conductor induces a field that, in turn, produces a current through windings in coil 12. Leads 18 from the transformer coil are coupled to a measurement circuit 20. The measurement circuit 20 is adapted to control the value of an effective burden resistance to maintain a substantially zero resistance value, and to measure a output by the leads 18 that will be indicative of the current induced in the transformer coil. Details of the measurement circuit 20 are provided below.

The current measurement system 10 illustrated in FIG. 1 may be designed for permanent or portable use. That is, the current transformer coil 12 may be fixed in a system with conductor 16 disposed therethrough during assembly of the system. The measurement circuit 20, then, may continuously or periodically measure current through the conductor. Alternatively, the system may be designed for portable use such that it may be installed temporarily at a desired application to measure currents. Similarly, the system may be interfaced with additional components, particularly in industrial installations, networked installations, and so forth. As illustrated in FIG. 1, for example, the measurement circuit 20 may produce a trip signal based upon the measured current, and apply the trip signal to an overload relay 22. The overload relay may be coupled to contacts (not shown) to interrupt current through conductor 16 when excessive current is detected by the measurement circuit 20. Still further, the measurement circuit 20 may be coupled to a remote monitoring and control systems 24, such as by an appropriate network link. The remote monitoring and control system 24 may be part of an overall industrial control or process control system that monitors the current, or controls one or more devices based upon the measured current. For example, the remote monitoring and control system 24 may send commands to an overload relay 22 to open the circuit in which conductor 16 is connected based upon the measured currents.

Figure 2:
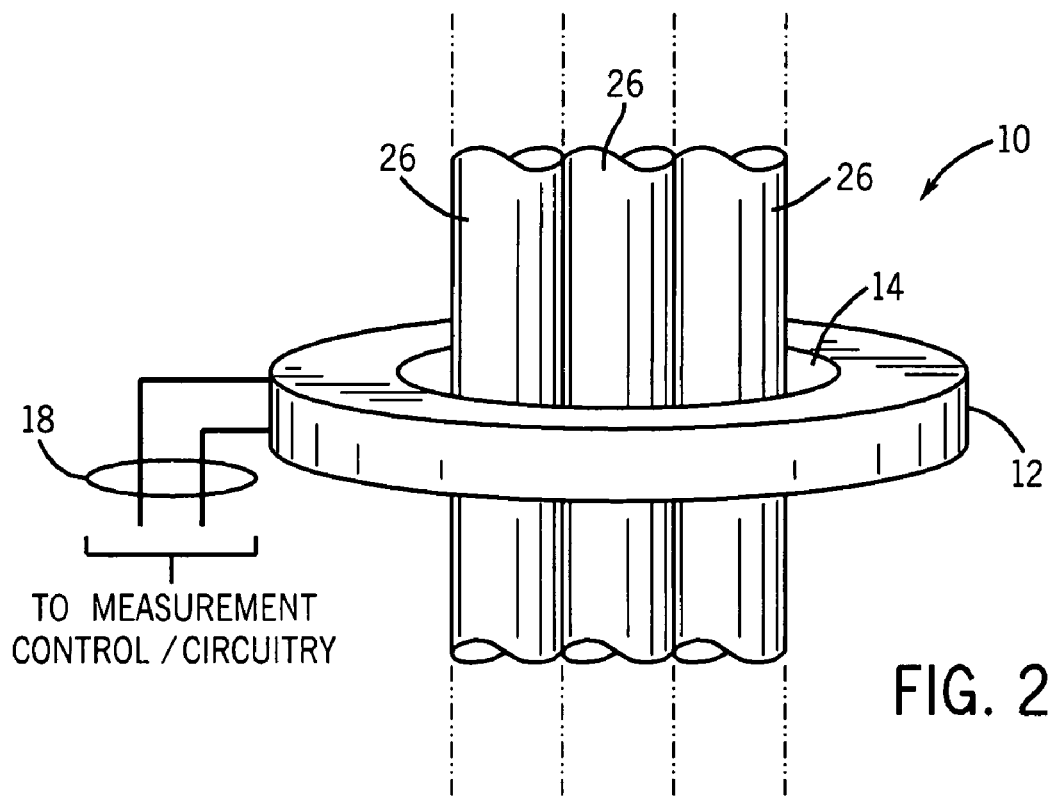
FIG. 2 is a diagrammatical representation of an application of the present system for measuring ground fault in a three-phase electrical system.

FIG. 2 illustrates diagrammatically how the same system may be used for ground fault detection. As will be appreciated by those skilled in the art, in a three-phase system, multiple phase conductors 26 will be employed for routing separate phases of electrical power to a load. When a ground fault in one or more of the conductors occurs, a phase imbalance arises, resulting in a detectable current. The transformer coil 12, then, may detect this resulting current and provide a measurement circuit with output as described above.

Figure 3:
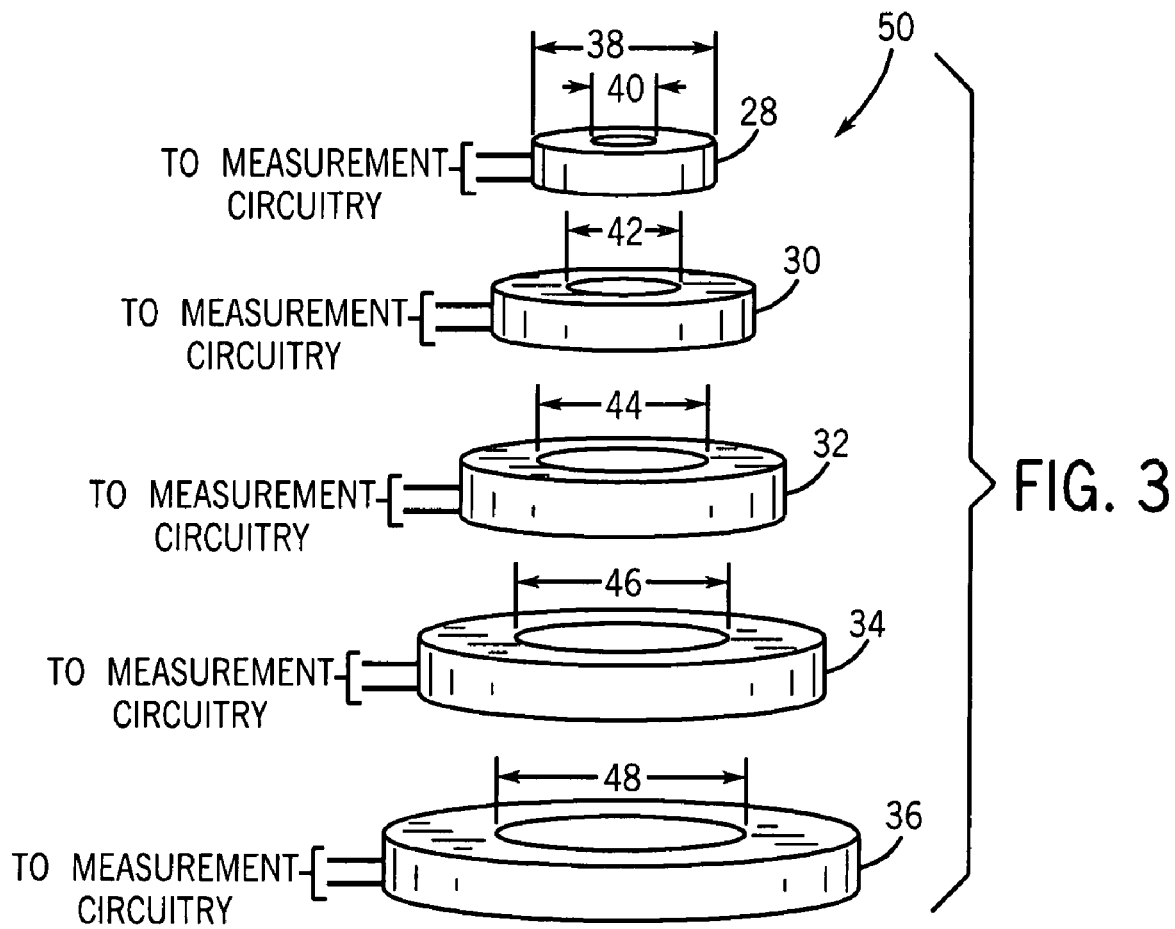
FIG. 3 is a perspective view of a family of transformer coils for use in the current measurement system of the present technique.

The present technique contemplates the use of a range of different sizes of current transformer coils through which different sizes or numbers of conductors may be passed. FIG. 3 illustrates five such transformer coils that may be used with a single measurement circuit as described more fully below. As shown in FIG. 3, a first coil 28 of relatively small size will have an outer dimension 38 and a window or aperture size 40 to accommodate smaller conductors, resulting in a known cross-sectional area. Additional coils 30, 32, 34 and 36 will provide graduated sizes having increased window sizes as indicated by reference numerals 42, 44, 46 and 48, respectively. The group of coils, then, forms a family, as indicated generally by reference numeral 50. Depending upon the sizes of the conductors, and the number of conductors through which current is to be detected, then, an appropriate one of the transformer coils may be selected.

To facilitate accurate measurement of currents while using transformer coils of different window sizes. Several parameters of the coils are common to all. In a present embodiment, for example, the number of turns of wire comprising each of the coils is the same, as is the wire size. For example, each of the coils in family 50 may have 1,000 turns of no. 28 wire in a presently contemplated embodiment. Moreover, the coils may be designed to maintain the same cross-sectional area across the family of coils. The resulting winding resistance for each of the coils is, therefore, approximately the same. In a presently contemplated family of coils, for example, opening sizes may range from less than 1 inch to more than 6 inches. Window sizes may, in a presently contemplated product, range in proportion to almost 10:1. As will be appreciated by those skilled in the art, as the mean diameter of the core surrounding the window increases, the phasor value of the impedance of the coil decreases proportionally. This decrease in impedance, according to the invention, is permitted without loss of accuracy by the use of an active circuit that reduces the value of an effective burden resistance to substantially zero. It is presently contemplated that the value of $R_w$ will remain substantially lower than the value of $jX_{Lm}$.

Figure 4:
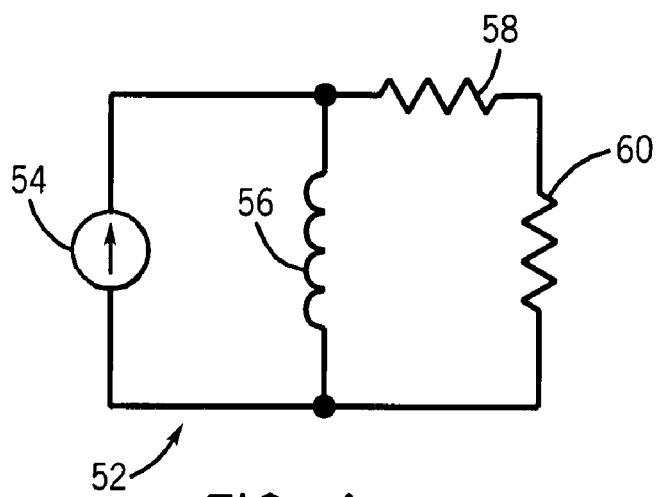
FIG. 4 is an equivalent circuit diagram for a current measurement system accommodating multiple differently sized transformer coils.

FIG. 4 represents an equivalent circuit for the current measurement system to explain certain of these relationships. The circuit 52 shown in FIG. 4 is illustrated as including a current source 54 which in the present case will be the one or more conductors passing through the current transformer. The inductive element 56 represents the reactive impedance (the phasor value $jX_{Lm}$). As will be appreciated by those skilled in the art, this impedance will have a particular value depending upon the mean core diameter of the current transformer for a specific frequency (e.g., 50 or 60 Hz). Resistor 58, then, represents the winding resistance of the transformer coil. Resistor 60 represents the burden resistance of the measurement circuit. The present invention is intended to reduce the effective burden resistance 60 to a substantially zero value. Thus, although the value of the inductive element 56 (i.e., the impedance $jX_{Lm}$) will change depending upon the selected transformer coil, each transformer coil will have the same or substantially the same winding resistance 58. As the value of the impedance is reduced with increases in the size of the mean diameter of the larger coils and their respective cores, then, substantially all current is nevertheless directed through the burden resistance 60. Mathematically, then, if the goal of the circuit design is to maintain the relationship:

$$jX_{Lm}/(jX_{Lm}+R_b+R_w) \cong 1,$$

this goal is reached by maintaining the value of $R_b$ substantially equal to zero, such that the relationship becomes:

$$jX_{Lm}/(jX_{Lm}+R_w) \cong 1.$$

This will remain the case so long as $R_w >> R_b$. Also, the value of $R_w$ should be significantly less than $jX_{Lm}$, to drive the value on the left hand side of the equation above to near unity. But as a practical matter, this will normally be the case for current transformers.

Figure 5:
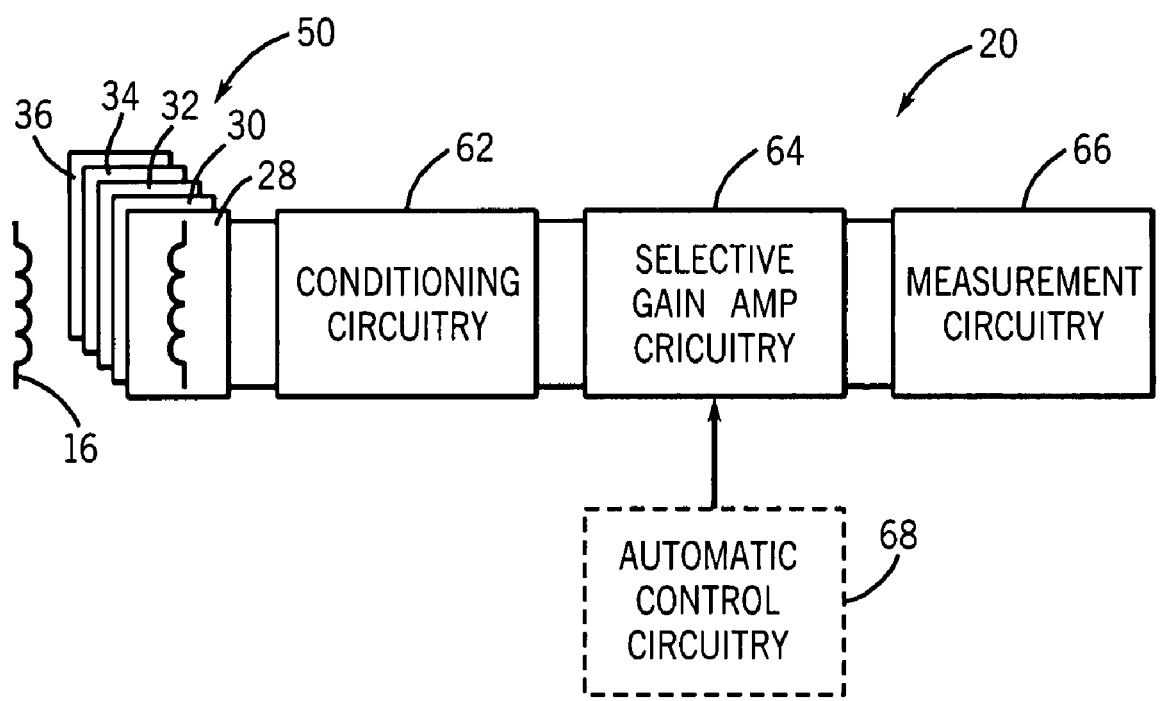
FIG. 5 is a high-level diagrammatical representation of a current measurement system in accordance with aspects of the present technique.

FIG. 5 is a diagrammatical illustration of a measurement circuit in accordance with the present technique designed to operate with any one of a family 50 of sizes of transformer coils. As will be appreciated by those skilled in the art, the conductor through which current passes that is to be measured may be represented by the transformer coil 16. Any one of coils 20, 30, 32, 34 or 36 may be selected to measure current through the conductor, with the selection typically being made based upon the conductor size and the anticipated current (which in many cases will dictate the conductor size). Conditioning circuitry 62, then, receives signals from the selected transformer coil, which effectively forms the secondary winding of the transformer. The conditioning circuitry may provide for protection of downstream circuitry, filtering, and so forth. An active circuit in the form of selective gain amplifier circuitry 64, then, presents a burden resistance that has an extremely small value substantially equal to zero. As described below, circuitry 64 may adapt to any one of the sizes of transformer coils utilized, and may be controlled manually or automatically. Measurement signals are thus produced that are detected by measurement circuitry 66. In presently contemplated embodiments, for example, voltage measurements are made that are indicative of currents applied to the effective burden resistance. The measurement circuitry may further include automatic control circuitry 68, such as a microprocessor or other processing component which can command switches or analogous devices in the selective gain amplifier circuitry to adapt the net gain depending upon the level of current sensed, thereby selecting the appropriate current range.

Figure 6:
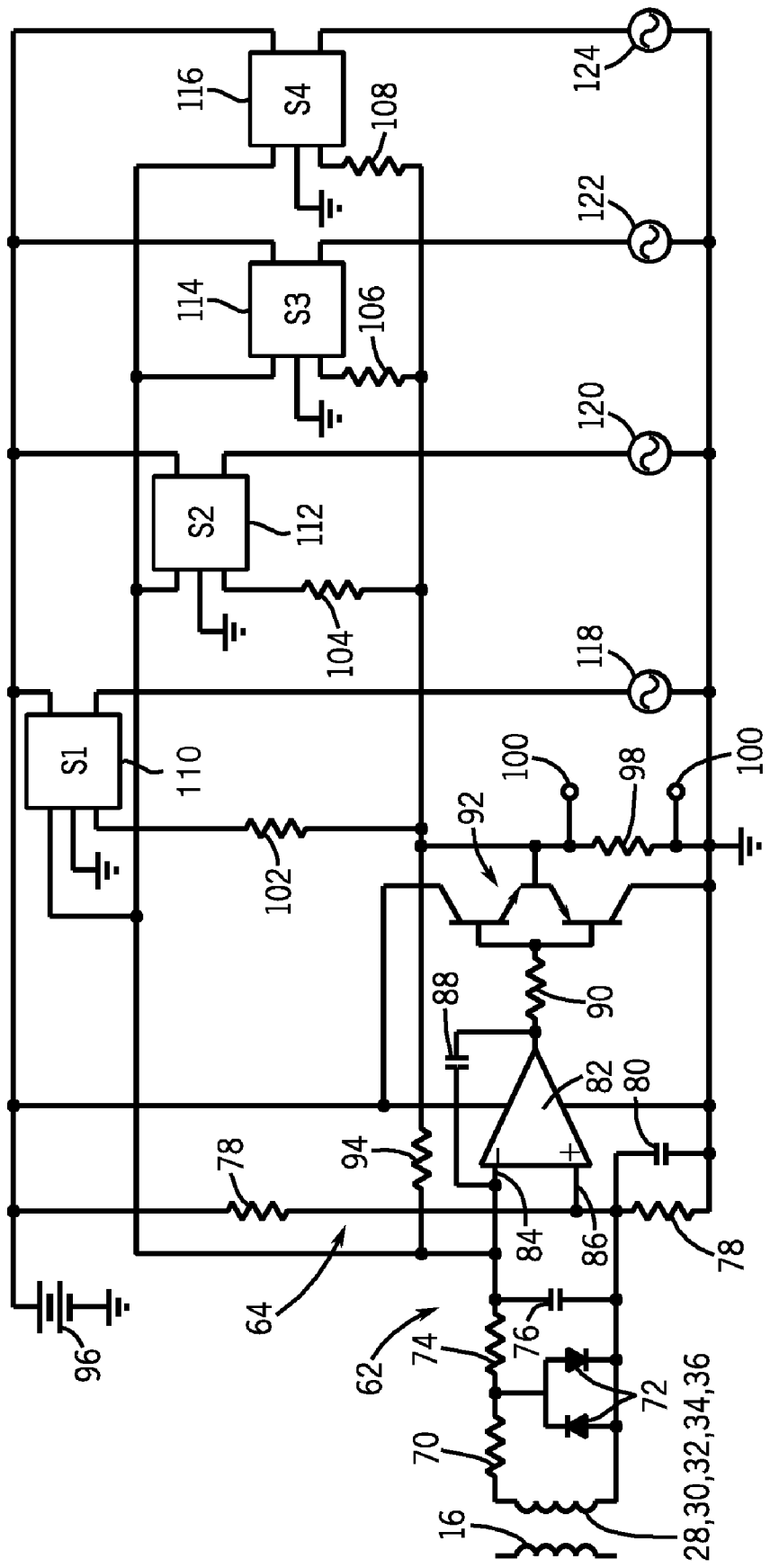
FIG. 6 is a more detailed schematic for the current measurement system active circuit used to accommodate different sizes of transformer coils in accordance with the present technique.

FIG. 6 illustrates exemplary circuitry for actively and selectively driving the effective burden resistance seen by the selected transformer coil and measuring circuit to a substantially zero value. As shown in FIG. 6, the coil through which current passes that is to be measured may be represented as the primary winding of a transformer, as indicated by reference numeral 16. The secondary winding of this transformer is effectively the selected transformer coil 28, 30, 32, 34 or 36. The circuitry illustrated in FIG. 6 includes certain protection and conditioning components, such as a resistor 70 and diodes 72 that serve to force the current transformer into saturation if the current applied to the circuitry is excessive, to protect the downstream circuitry, including an operational amplifier described below. The resistor 70 serves to protect the diodes 72. A further resistor 74 controls the offset current that the operational amplifier described below can generate, so as to control the bias on the current transformer. A capacitor 76 may be included for high frequency noise reduction. Furthermore, components such as a resistor 78 and capacitor 80 are included in the illustrated circuitry to form a half-rail split divider. These particular components allow for 12 volts to be applied by a power source 96, and produce a 6 volt output. Thus, an AC signal may be applied to an operational amplifier 82 to produce an output of + or −6 volts.

The selective gain amplifier circuitry 64, then, is based in the illustrated embodiment upon operational amplifier 82 which has a negative input 84 and a positive input 86. In the illustrated embodiment, a capacitor 88 is provided in a feedback loop from the output of the operational amplifier to the negative input to stabilize the circuitry at higher frequencies. Moreover, a resistor 90 is included in the circuitry to help stabilize the system, and prevent overdriving of the operational amplifier. In the illustrated embodiment, a current amplifier stage is provided on the output of the operational amplifier 82, as designated generally by reference numeral 92. As will be appreciated by those skilled in the art, the amplifier stage 92 allows the operational amplifier to provide more current than its internal driver would otherwise permit. The amplifier stage 92 is not needed in the circuitry where a different operational amplifier than the one presently contemplated is used or where a lower current sensing range is used.

The circuitry further includes resistors in the feedback loop for the operational amplifier 82 that allow the circuitry to adapt the effective burden resistance to the particular transformer utilized. In the illustrated embodiment, a permanent feedback resistor 94 is provided in a feedback loop to the negative input 84 of the operational amplifier. It will be noted that the junction point of the amplifier stage 92 is effectively the same output point as the output of the operational amplifier. If an amplifier stage 92 is not employed, resistor 94 would, of course, be provided in the feedback loop directly from the output of the operational amplifier.

Measurements taken from the circuit are voltage measurements around a load resistor 98, as indicated by measurement nodes 100. As will be appreciated by those skilled in the art, in practice, in order only to measure the AC component of the current, the DC split rail voltage is also sensed and subtracted from the measurement taken at nodes 100.

The circuitry allows for switching resistors into a parallel current path with a feedback resistor 94 to effectively reduce the feedback resistance. In a presently contemplated embodiment, for example, five different feedback resistances may be provided by sequentially switching additional feedback resistors 102, 104, 106 and 108 into the feedback loop. Each of the resistors in the feedback loop, other than the permanent resistor 94, is coupled to a respective switch 110, 112, 114 and 116 that is controlled by a control device 118, 120, 122 and 124, respectively. By means of a control signal applied by the control devices, then, switches 110, 112, 114 and 116 can be placed in a conductive state to place the respective resistor in parallel with resistor 94, and in parallel with one another.

For example, in a presently contemplated embodiment, resistor 94 may have a value of 10 kΩ, while resistors 102, 104, 106 and 108 may have values of 2.5 kΩ, 2 kΩ, 250Ω and 22.2Ω, respectively. These selected values allow for a feedback resistance of 10 kΩ (when none of the additional resistances is placed in parallel with resistor 94), 2 kΩ (when resistor 110 is switched in parallel with resistor 94), 1 kΩ (when resistor 104 is switched in parallel), 200Ω (when resistor 106 is switched in parallel) and 20Ω (when resistor 108 is switched in parallel). The resulting arrangement provides for a 2500:1 amplification range to match the range of the transformer coils which may be selected for use with the circuitry. It should be noted that these values are provided here by way of example only, and other values, or more or fewer different values may be utilized, depending upon the range desired and the configuration of the transformer coils.

It should be noted that the circuitry illustrated in FIG. 6 may be manually controlled or automatically controlled. For example, the control devices 118, 120, 122 and 124 may be DIP switches that are manually set based upon the desired sensed current range. In certain implementations, however, automatic control circuitry (discussed above with reference to FIG. 5 as component 68) may be coupled to the switches illustrated in FIG. 6, such as port lines of a microprocessor or other programmable device. The circuitry, then, provides for automatic detection of the current range and switch in or out the appropriate resistor to achieve the desired dynamic range of the measurement output.

Used in conjunction with a selected one of the family of transformer coils, then, the circuitry allows for decreases in the value of $jX_{Lm}$, without introducing additional error in measurements. As noted above, the circuitry may be used in conjunction with transformer coils measuring currents in single phase circuits, on single conductors, or in ground fault detection circuitry in which three line conductors will typically pass through the selected transformer coil. A clear advantage of the circuitry and its operation is the ability to use the same conditioning and monitoring circuitry for any one of the family of transformer coils with little or no manual alteration, and with fully automatic adaptive configuration where desired.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system for measuring current comprising:
    a family of transformer coils, each coil in the family having substantially the same number of turns of wire having substantially the same resistance, the coils of the family having different window sizes through which one or more conductors may be passed; and
    an active conditioning circuit configured to be coupled to any one of the coils of the family and configured to present a substantially zero burden resistance for measurement of current through the one or more conductors.

2. The system of claim 1, wherein the family includes at least 3 differently sized coils.

3. The system of claim 1, wherein the family includes coils having window diameters with a range of at least approximately 5:1.

4. The system of claim 1, wherein the transformer coils of the family have substantially the same cross-sectional area.

5. The system of claim 1, wherein the active conditioning circuit includes an operational amplifier and a plurality of feedback resistances that may be selectively placed in a feedback loop around the operational amplifier to adapt a resistance of the feedback loop.

6. The system of claim 5, wherein adapting the resistance of the feedback loop selects a range of currents that can be measured by the system.

7. The system of claim 5, wherein the feedback resistances are associated with switches, the states of which are manually selectable.

8. The system of claim 5, wherein the feedback resistances are associated with switches, the states of which are automatically selectable.

9. The system of claim 5, wherein the active conditioning circuit can adapt the resistance of the feedback loop within a range of at least approximately 1000:1.

10. The system of claim 5, wherein the active conditioning circuit can adapt the resistance of the feedback loop within a range of at least approximately 2500:1.

11. A method for measuring current comprising:
    selecting a transformer coil from a family of coils, each coil in the family having substantially the same number of turns of wire having substantially the same resistance, the coils of the family having different window sizes;
    routing at least one conductor through the window of the selected transformer coil;
    controlling an active conditioning circuit coupled to the selected transformer coil to present a substantially zero burden resistance; and
    measuring a current through the at least one conductor.

12. The method of claim 11, further comprising providing a current measurement signal to a remote monitoring or control system via a network link.

13. The method of claim 11, further comprising generating a trip signal based upon the measured current.

14. The method of claim 13, further comprising applying the trip signal to a relay to interrupt power to the at least one conductor.

15. The method of claim 11, wherein three phase conductors are routed through the selected transformer coil to detect ground faults in a three phase system based upon measured current.

16. The method of claim 11, wherein the active conditioning circuit includes an operational amplifier and a plurality of feedback resistances that may be selectively placed in a feedback loop around the operational amplifier to adapt a resistance of the feedback loop.

17. The method of claim 16, wherein adapting the resistance of the feedback loop selects a range of currents that can be measured.

18. The method of claim 16, comprising manually selecting the feedback resistances via switches.

19. The method of claim 16, comprising automatically selecting the feedback resistances.

* * * * *